US009482697B2

(12) United States Patent
Javora et al.

(10) Patent No.: US 9,482,697 B2
(45) Date of Patent: Nov. 1, 2016

(54) COMBINED MEASURING AND DETECTION SYSTEM

(71) Applicant: ABB Technology AG, Zurich (CH)

(72) Inventors: Radek Javora, Brno (CZ); Carlo Gemme, Pavia (IT); Gabriele Valentino De Natale, Milan (IT)

(73) Assignee: ABB Schweiz AG, Baden (CH)

( * ) Notice: Subject to any disclaimer, the term of this patent is extended or adjusted under 35 U.S.C. 154(b) by 618 days.

(21) Appl. No.: 13/916,636

(22) Filed: Jun. 13, 2013

(65) Prior Publication Data

US 2013/0271116 A1   Oct. 17, 2013

Related U.S. Application Data

(63) Continuation of application No. PCT/EP2011/069433, filed on Nov. 4, 2011.

(30) Foreign Application Priority Data

Dec. 15, 2010   (EP) ..................................... 10015644

(51) Int. Cl.
*G01R 1/30*   (2006.01)
*G01R 31/12*   (2006.01)
*G01R 31/327*   (2006.01)

(52) U.S. Cl.
CPC ............ *G01R 1/30* (2013.01); *G01R 31/1254* (2013.01); *G01R 31/3271* (2013.01)

(58) Field of Classification Search
CPC ........... G01R 31/027; G01R 31/1227; G01R 31/1254; G01R 31/1272; G01R 31/3271; G01R 1/30; G01R 15/16
See application file for complete search history.

(56) References Cited

U.S. PATENT DOCUMENTS 5,903,158 A * 5/1999 Eriksson ............ G01R 31/1227
                                                    324/536
6,766,703 B1 * 7/2004 Kluth ...................... E21B 23/08
                                                    73/152.28

(Continued)

FOREIGN PATENT DOCUMENTS

CZ         9701312 A3    11/1998
DE         4316239 A1    11/1994

(Continued)

OTHER PUBLICATIONS

International Search Report (PCT/ISA/210) issued on Dec. 9, 2011, by the European Patent Office as the International Searching Authority for International Application No. PCT/EP2011/069433.

(Continued)

*Primary Examiner* — Minh N Tang
*Assistant Examiner* — David Frederiksen
(74) *Attorney, Agent, or Firm* — Taft Stettinius & Hollister LLP

(57) ABSTRACT

A combined measuring and detection system is disclosed which includes an electronic evaluation unit for analyzing a broad frequency spectrum of measured quantities and one or more measuring devices for measurement of one or more of a magnetic field, an electric field, a current, and a voltage. The measuring devices are operatively connected to the electronic evaluation unit, which is provided with at least one frequency splitter dividing the measured quantities into a low frequency component and into a high frequency component. Low frequency components are used for measurement and protection analysis and high frequency components are used to detect partial discharges activity.

14 Claims, 3 Drawing Sheets

(56) References Cited

U.S. PATENT DOCUMENTS

| | | | |
|---|---|---|---|
| 6,992,580 B2 * | 1/2006 | Kotzin | G08B 21/0453 340/539.11 |
| 7,336,063 B1 * | 2/2008 | Bierer | G01R 15/16 324/72.5 |
| 2004/0130328 A1 * | 7/2004 | Koo | G01R 31/1272 324/536 |
| 2008/0309351 A1 | 12/2008 | Stewart et al. | |
| 2009/0066952 A1 * | 3/2009 | Wu | G01R 31/308 356/365 |
| 2009/0167301 A1 * | 7/2009 | Ausserlechner | G01R 33/0035 324/252 |
| 2010/0073008 A1 | 3/2010 | Twerdochlib | |
| 2010/0079148 A1 | 4/2010 | Park et al. | |
| 2010/0163743 A1 | 7/2010 | Shong et al. | |
| 2010/0194403 A1 * | 8/2010 | Nam | G01R 31/1254 324/551 |
| 2010/0259275 A1 * | 10/2010 | Grieshaber | H01H 33/26 324/522 |
| 2011/0156720 A1 * | 6/2011 | Di Stefano | G01R 31/1272 324/629 |

FOREIGN PATENT DOCUMENTS

| | | | |
|---|---|---|---|
| DE | 10134790 A1 * | 1/2003 | G01R 31/3271 |
| DE | 10318951 A1 | 11/2004 | |
| EP | 1705491 A1 | 9/2006 | |
| GB | 2429790 A | 3/2007 | |

OTHER PUBLICATIONS

Written Opinion (PCT/ISA/237) issued on Dec. 9, 2011, by the European Patent Office as the International Searching Authority for International Application No. PCT/EP2011/069433.

* cited by examiner

COMBINED MEASURING AND DETECTION SYSTEM

RELATED APPLICATIONS

This application claims priority as a continuation application under 35 U.S.C. §120 to PCT/EP2011/069433, which was filed as an International Application on Nov. 4, 2011 designating the U.S., and which claims priority to European Application 10015644.7 filed in Europe on Dec. 15, 2010. The entire contents of these applications are hereby incorporated by reference in their entireties.

FIELD

The present disclosure relates to a combined measuring and detection system, which can, for example, be used with associated electrical equipment, such as for medium voltage switchgears.

Medium voltage switchgears can be provided with a current and a voltage measurement in order to measure flow quantities. The measurement can be done by devices in each phase. There also exist some combined units, capable of both current and voltage measurement and accommodated in one body/unit. An output of current and/or voltage measurement devices can be used not only for the measurement, but also for recording these values, or for protection purposes as well. In any case, outputs of measuring devices can be connected to some evaluation devices which further process the measured values.

In many cases where there is a desire for a continuous or one-time monitoring of partial discharges activity inside the medium voltage switchgears, separate devices are used. Some sensing elements are used for that purpose as well as some evaluation devices. These devices can have their own data sharing/evaluation capabilities (if used) or a display.

It can, therefore, be desirable to have in medium voltage switchgears, both current and/or voltage measurement, and a continuous or one-time monitoring of partial discharges activity. Due to space and cost specifications of many desired measuring and evaluating instruments and sensors, it can be difficult to accommodate all of them in a medium voltage switchgear. Therefore, it can be desirable to have one combined measuring and detection system that could measure, detect and evaluate the results of the current and/or voltage measurement and the continuous or one-time monitoring of the partial discharges activity.

Patent No. CZ 284 557 discloses a partial discharges measuring device where the measurement is done on a load impedance. The measuring device is actually a digital replacement of an older analogue device, which gives the user a possibility to simply determine a phase angle and a charge magnitude. There is no combined measurement of partial discharges and voltage and/or current.

Patent Application No. US 2010/0163743 discloses a method and apparatuses for measuring partial discharges using an UV sensor array that converts the UV rays into a discharge current and the partial discharges intensity is then measured by measuring a UV intensity. The system enables detection of an UV emitting location. There is no combined measurement of partial discharges and voltage and/or current.

Patent Application No. US 2010/0079148 discloses a measuring device designed for localization of a UHF partial discharge which appears in high-voltage power devices. The measuring device includes a partial discharge sensor, an external noise sensor, an analogue-digital converter, a peak detector, a partial discharge signal processor, an arrival time detector, a discharge location processor, and a display unit. Again, there is no combined measurement of partial discharges and voltage and/or current.

Patent No. EP 1 705 491 discloses a method of accurately determining the presence or absence of partial discharges generated in a gas-insulated equipment by eliminating an influence of an external noise. No combined measurement of partial discharges and voltage and/or current is disclosed.

Patent Application No. US 2010/0073008 discloses a partial discharge coupler for a partial discharge detection in a conductor carrying a high voltage alternating current signal. A high pass filter is provided to filter a high frequency signal that corresponds to a partial discharges signal. The measurement of partial discharges is not combined with a measurement of voltage and/or current.

Known solutions do not include one combined measuring and detection system that could measure, detect and evaluate the results of the current and/or voltage measurement and the continuous or one-time monitoring of the partial discharges activity.

SUMMARY

A combined measuring and detection system is disclosed, comprising: an electronic evaluation unit for analyzing a broad frequency spectrum of measured quantities; and one or more measuring devices for measurement of one or more of a magnetic field, an electric field, a current, and a voltage, said one or more measuring devices being operatively connected to the electronic evaluation unit, wherein the electronic evaluation unit is provided with at least one frequency splitter dividing measured quantities into a low frequency component for a measurement and protection analysis and into a high frequency component for detection of partial discharges.

BRIEF DESCRIPTION OF THE DRAWINGS

The invention is described in greater detail with respect to exemplary embodiments in the drawings, wherein.

DETAILED DESCRIPTION

A combined measuring and detection system is disclosed that includes an electronic evaluation unit for analyzing a broad frequency spectrum of measured quantities and one or more measuring devices for measurement of one or more of a magnetic field, an electric field, a current, and a voltage, the one or more measuring devices being operatively connected to the electronic evaluation unit, wherein the electronic evaluation unit is provided with at least one frequency splitter dividing the measured quantities into a low frequency component for a measurement and protection analysis and into a high frequency component for detection of partial discharges.

In an exemplary embodiment, the combined measuring and detection system comprises as the measuring device for measurement of a magnetic field, a magnetic field sensor which is a broadband sensor for measuring low and high-frequency components of the measured magnetic field.

In another exemplary embodiment, the combined measuring and detection system comprises as the measuring device for measurement of an electric field an electric field sensor which is a broadband sensor for measuring low and high-frequency components of the measured electric field.

In a further exemplary embodiment, the combined measuring and detection system comprises at least one additional sensor selected from a group consisting of a pressure sensor, an acoustic sensor, a humidity sensor, a temperature sensor and a radio-frequency interference sensor, said at least one additional sensor being an external and/or internal part of said magnetic field sensor or said electric field sensor.

The measuring devices can be, in different exemplary embodiments, single and separate devices or they can be combined units, containing more than one sensor in a single device or unit.

The magnetic and/or electric field sensors can be, in different embodiments, one phase device or three-phase devices or polyphase devices.

All components of the combined measuring and detection system can be either integrated into a single device or some components can be separate devices providing relevant signals to the electronic evaluation unit.

In another exemplary embodiment, the combined measuring and detection system comprises an overall supervisory system coupled to the electronic evaluation unit by means of wires and/or cables and/or wireless connection.

Further, a circuit breaker and an electric switchgear are disclosed which can comprise, respectively, a combined measuring and detection system as described herein.

Figure 1:
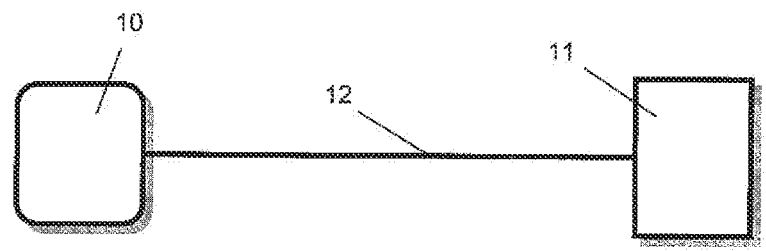
FIG. 1 shows an exemplary current and/or voltage measurement scheme.

FIG. 1 shows a possible scheme for a current and/or voltage measurement. An evaluation unit 10 is used for protection and/or for measurement purposes. It is basically an electronic unit, evaluating signal coming from a sensing device 11. The evaluation unit 10 processes the signal, evaluates it and provides desired output or action. The sensing device 11 measures specified quantities at particular levels, e.g. current and/or voltage levels, e.g. of an associated electrical conductor, and provides an output signal, that corresponds to the measured quantities, to the evaluation unit 10. The output signal from the sensing device 11 has properties (e.g., voltage or current levels) suitable for the evaluation unit 10. The connection from the sensing device 11 to the evaluation unit 10 can be wireless, or also done by means of some wires or cables 12, in order to transmit the measured signal.

Figure 5:
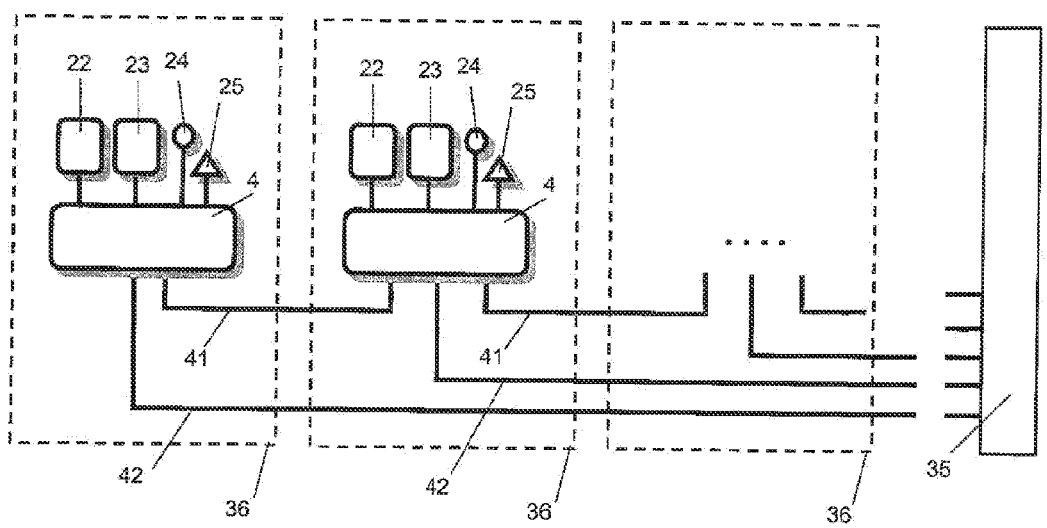
FIG. 5 shows a combined partial discharges measurement plus a current and/or voltage measurement scheme with connection to an overall supervisory system according to an exemplary embodiment.

Apart from this, the evaluation unit 10 can provide the output signal to the other evaluation devices located in the other places and/or to an overall supervisory system 35 as illustrated in FIG. 5.

Figure 2:
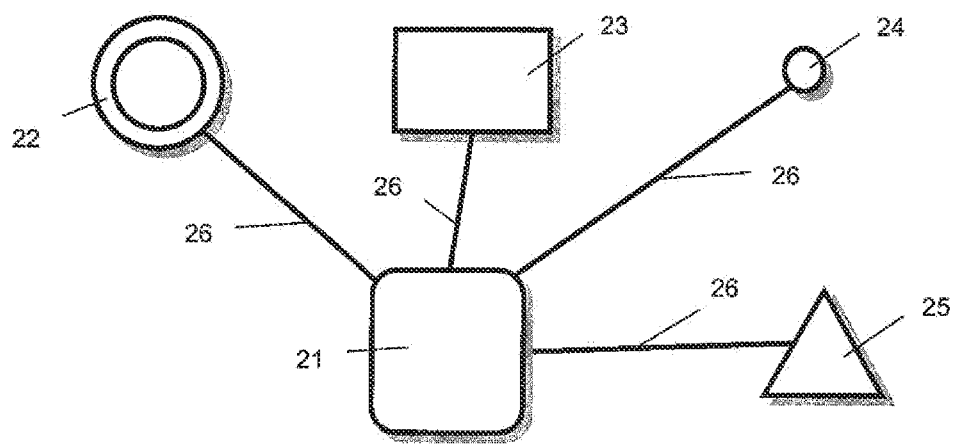
FIG. 2 shows an exemplary partial discharge measurement scheme.

FIG. 2 shows a possible scheme for partial discharges measurement. An evaluation unit 21 is, for example, a device which receives and analyzes signals from different sensing devices. One of the partial discharges sensing devices is a magnetic field sensor 22 which can measure a magnetic field and provide reliable results for high frequency components. A magnetic field sensor 22 can be a current transformer designed for a reliable measurement of high-frequency components or a Rogowski coil. This magnetic field sensor 22 can be used for a detection of partial discharges in cables. An output signal of this magnetic field sensor 22 is analyzed for a high-frequency content of the flowing current. Another sensing device is an electric field sensor 23 that measures an electric field and provides reliable results for high frequency components. This electric field sensor 23 can be a transient earth voltage sensor that is based on a principle of a capacitive coupling with a switchgear wall, and is used for a detection of partial discharges inside of the switchgear/panel. It can be either a separate device, e.g. a capacitive divider in a post-insulator, or it can be a part of the capacitive divider. Such electric field sensors 23 very well analyze high-frequency oscillations in the system.

In order to detect corona or surface discharges that may occur along the surface of insulators or other devices which exhibit sound, an acoustic sensor 24 is used. The acoustic sensor 24 can be, for example, a kind of microphone which provides a measured signal to the evaluation unit 21 or any other kind of acoustic sensor.

Further, there are some additional factors, which can influence the measured level of partial discharges. These factors could be, for example, humidity, temperature and external electromagnetic noise. Due to this fact, additional sensing devices 25 could be used to take these factors into account. Outputs of these additional sensing devices 25 are coupled to the evaluation unit 21 and the evaluation unit 21 corrects the measured results, received by electric, magnetic or acoustic sensor, accordingly. It can be desirable to provide the signals from any or all of the above mentioned sensing devices 22 through 25 to the evaluation unit 21. This can be done by means of connecting wires or cables 26.

Apart from this, the evaluation unit 21 can provide an output signal to the other evaluation devices located in the other places and/or to an overall supervisory system 35.

In case it is desired to measure voltage and/or current as well as to properly detect partial discharges for one application device 36, a high amount of components can be involved.

Figure 3:
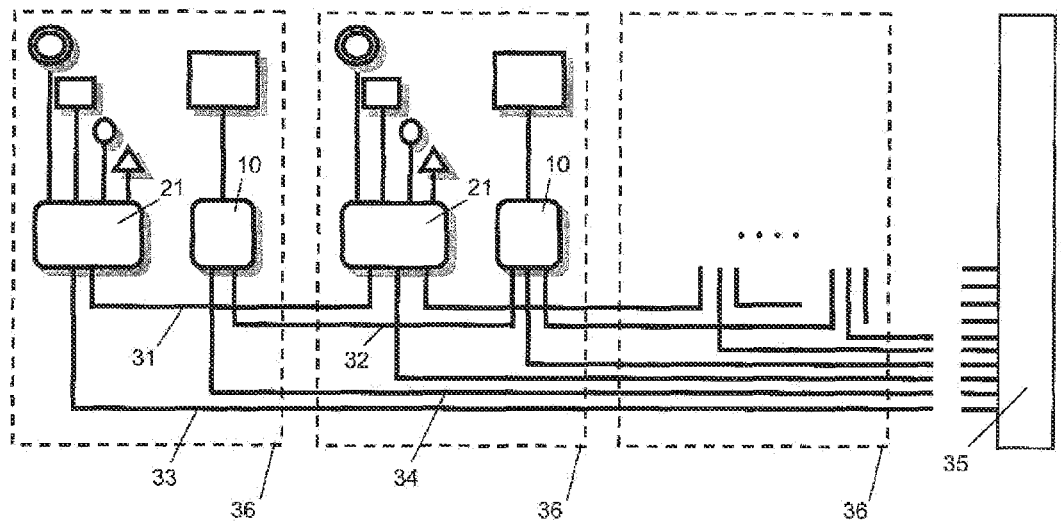
FIG. 3 shows a partial discharge measurement scheme together with a current and/or voltage measurement scheme with connection to an overall supervisory system according to an exemplary embodiment.

When several application devices 36 are controlled together and current and/or voltage monitoring as well as partial discharges monitoring are desired, the situation can become much more complex. It may be desired for the devices to share monitored information among each other as well as to provide each its own information to the overall supervisory system 35. Connections among the devices can be done through separate links 31 of the evaluation units 21 and separate links 32 of the evaluation units 10. Connection to the overall supervisory system 35 can be done through separate links 33 and 34, which increase a complexity of the overall solution and cause extensive cabling also towards the overall supervisory system 35 that collects all the information, as illustrated in FIG. 3.

Figure 4:
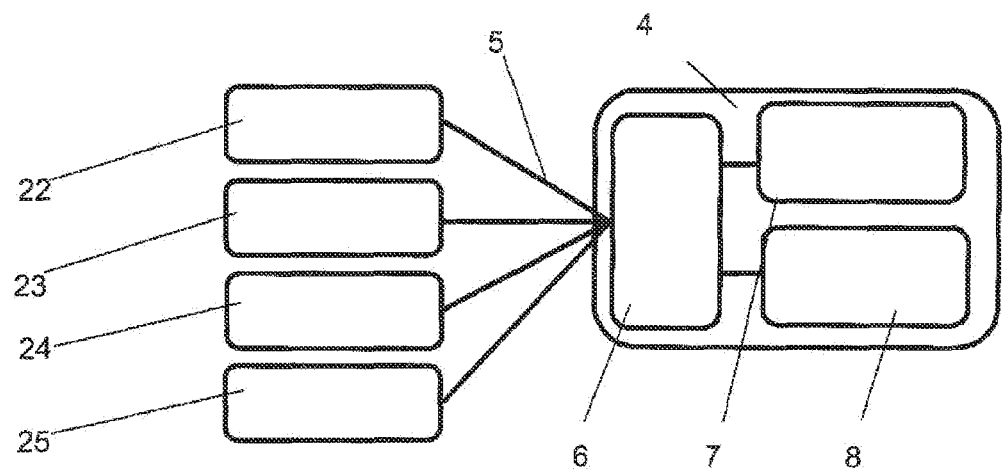
FIG. 4 shows a scheme of a combined measuring and detection system according to an exemplary embodiment.

FIG. 4 describes schematically a combined measuring and detection device used in the system as disclosed herein. Such device may contain the magnetic field sensor 22, the electric field sensor 23, the acoustic sensor 24 and some other auxiliary sensors 25. The magnetic field sensor 22 and the electric field sensor 23 are connected to an input board 6, of a combined electronic evaluation unit 4. The electronic evaluation unit is for example a microprocessor-based electronic unit with the input board 6 being an interface electronic unit with the sensors. The magnetic field sensor 22 could be, for example, a current transformer capable of measuring high-frequency components or a device based on a Rogowski coil, but basically any kind of device capable of measuring low as well as high frequencies of the magnetic field is possible. The electric field sensor 23 could be, for example, an antenna or a capacitive divider, but basically any kind of device capable of measuring an electric field, in low as well as high frequency bands, is possible. It could be also possible to use the same concept in case the sensors are configured in multi-phase manner or as a combined unit.

The magnetic field sensor 22 and the electric field sensor 23 could be part of the input board 6 or they can be connected with the input board 6 by an external link 5. The single input board 6 splits measured signals into two groups. A group containing high frequency components is further processed in a high frequency processing unit 7 for an analysis of partial discharges and the other group containing low frequency components is further processed in a low frequency processing unit 8 for measurement or protection application/processing.

The acoustic sensor 24 and the other sensors 25 could be connected either to the same input board 6 of the combined evaluation unit 4 or they could be connected directly to the high frequency processing unit 7 for an analysis of the partial discharges.

The use of the disclosed system can enable significant reduction of the amount of the used devices and cabling. In case of several application devices 36, there may be only one link 41 between two combined evaluation units 4 connected in daisy chain, and there is only one link 42 between one combined evaluation unit 4 and the overall supervisory system 35, as indicated in FIG. 5.

In practice, it has been found that an exemplary combined measuring and detection system according to the present disclosure can provide improvements over existing solutions, allowing overcoming the issues previously mentioned with a quite simple solution.

A simple element of this disclosure is based on the fact that present voltage sensors used for measurement of current and/or voltage could be based on the same principles as those used for partial discharges detection/monitoring. For example, some instrument transformers or so called electronic instrument transformers or sensors are nowadays based on principles of an inductive current transformer, Rogowski coil and capacitive divider (e.g., they could be used for partial discharges detection or monitoring as well).

Further, this disclosure foresees to combine the current and/or voltage measurement with partial discharges detection functionality (e.g., to use current and voltage measurement devices and analyze their output values by a single device, but in different frequency groups). Low frequency components should be related to measurement and protection analysis and high frequency components should be related to partial discharges activity.

The evaluation unit of the whole system analyzes the signals coming from the measurement devices in a wide range of frequencies and splits them in two groups. One group containing low frequency components of the measured signals can be used for current and/or voltage measurement or for protection purposes and the other group with high frequency components of the measured signal can be used for partial discharges detection/monitoring purposes. The partial discharges analysis functionality could be added into existing protection/monitoring relays, which can easily become such an evaluation unit. There is already a communication system and appropriate hardware to further process analyzed signals, therefore no additional equipment mounted inside or outside of the switchgear would be needed, with the exception of some useful sensors for measuring or detecting different quantities, such as acoustic or noise signal or humidity or temperature or pressure or radio frequency interference (electromagnetic noise) or other quantities that can influence the occurrence or intensity of partial discharges and that are not included inside of the current or voltage measurement devices.

The combined measuring and detection system according to the present disclosure is particularly suitable for use with a circuit breaker, and/or an electrical switchgear, e.g. a medium voltage panel, such as for medium voltage applications; accordingly, the present disclosure also relates to a circuit breaker and/or an electrical switchgear each characterized in that it comprises contacts and a combined measuring and detection system as previously described and defined herein.

The switchgear device thus disclosed is susceptible of modifications and variations, all of which are within the scope of the inventive concept including any combination of the above described embodiments; all details may further be replaced with other technically equivalent elements. For example, it is possible to move a bushing together with the respective piece 15 (and also with all intermediary pieces there might be present in between) as a unique body relative to the casing 1, in which case the piece 15 can be considered as a piece operatively associated to and solidly moving with the respective bushing; or it is possible to move together with a bushing (and again also with all intermediary pieces there might be present between the bushing 6 and the casing 1) even a part of the main portion 9 of the casing 1 relative to the remaining portions of the casing 1 itself.

In practice, the materials, so long as they are compatible with the specific use, as well as the individual components, may be any according to the requirements and the state of the art. For example, a bushing can be realized with a tube of composite material, such as fiberglass with silicon sheds molded thereon, or may be realized by means of porcelain with fins made of glass, and the rings 21, 22 may be realized with a different material, et cetera.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

The invention claimed is:

1. Combined measuring and detection system, comprising:
    an electronic evaluation unit for analyzing a broad frequency spectrum of measured quantities, the electronic evaluation unit comprising at least one frequency splitter for dividing the measured quantities into a low frequency component for a measurement and protection analysis and into a high frequency component for detection of partial discharges;
    a magnetic field sensor for measurement of a magnetic field, and an electric field sensor for measuring an electric field, the magnetic field sensor and the electric field sensor being operatively connected to the electronic evaluation unit; and
    at least one additional sensor selected from the group consisting of: a pressure sensor, an acoustic sensor, a humidity sensor, a temperature sensor, and a radio-frequency interference sensor, the at least one additional sensor being at least one of an external part and an internal part of the magnetic field sensor or the electric field sensor.

2. Combined measuring and detection system according to claim 1, wherein said magnetic field sensor is a broadband sensor for measuring low and high-frequency components of the measured magnetic field.

3. Combined measuring and detection system according to claim 2, wherein said electric field sensor is a broadband sensor for measuring low and high-frequency components of the measured electric field.

4. Combined measuring and detection system according to claim 1, wherein said electric field sensor is a broadband sensor for measuring low and high-frequency components of the measured electric field.

5. Combined measuring and detection system according to claim 1, wherein the magnetic field sensor and the electric field sensor are single and separate devices.

6. Combined measuring and detection system according to claim 1, wherein the magnetic field sensor and the electric field sensor are combined units containing more than one of the sensors in a single device.

7. Combined measuring and detection system according to claim 1, wherein at least one of the magnetic field sensor and the electric field sensor is a single-phase device.

8. Combined measuring and detection system according to claim 1, wherein at least one of the magnetic field sensor and the electric field sensor is a polyphase device.

9. Combined measuring and detection system according to claim 1, wherein the magnetic field sensor and the electric field sensor are integrated into a single device.

10. Combined measuring and detection system according to claim 1, wherein at least one of the magnetic field sensor, the electric field sensor, and the at least one additional field sensor is/are separate devices providing relevant signals to the electronic evaluation unit.

11. Combined measuring and detection system according to claim 1, comprising:
 a supervisory system coupled to the electronic evaluation unit by wires and/or cables and/or wireless connection.

12. Combined measuring and detection system according to claim 1, wherein the combined measuring and detection system is integrated on board a circuit breaker.

13. A circuit breaker comprising:
circuit breaker contacts; and
 a combined measuring and detection system according to claim 1.

14. An electrical switchgear comprising:
switchgear contacts; and
 a combined measuring and detection system according to claim 1.

* * * * *